United States Patent
Panda et al.

(10) Patent No.: US 7,288,482 B2
(45) Date of Patent: Oct. 30, 2007

(54) SILICON NITRIDE ETCHING METHODS

(75) Inventors: Siddhartha Panda, Beacon, NY (US); Richard Wise, New Windsor, NY (US); Srikanteswara Dakshina Murthy, Bangalore (IN); Kamatchi Subramanian, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,252

(22) Filed: May 4, 2005

(65) Prior Publication Data

US 2006/0252269 A1 Nov. 9, 2006

(51) Int. Cl.
*H01L 21/461* (2006.01)

(52) U.S. Cl. .................. 438/689; 257/E21.017

(58) Field of Classification Search .............. 438/689, 438/724, 757, 744
See application file for complete search history.

(56) References Cited

U.S. PATENT DOCUMENTS

| | | | |
|---|---|---|---|
| 5,352,617 A | 10/1994 | Miwa | |
| 5,786,276 A | 7/1998 | Brooks et al. | |
| 6,015,760 A | 1/2000 | Becker et al. | |
| 6,287,978 B1 | 9/2001 | Becker et al. | |
| 6,475,906 B1 | 11/2002 | Lee | |
| 6,586,324 B2 | 7/2003 | Huang et al. | |
| 6,589,879 B2 * | 7/2003 | Williams et al. | 438/714 |
| 6,716,571 B2 * | 4/2004 | Gabriel et al. | 430/313 |
| 6,884,736 B2 * | 4/2005 | Wu et al. | 438/740 |
| 6,905,968 B2 * | 6/2005 | Hsieh et al. | 438/706 |
| 2002/0000423 A1 | 1/2002 | Becker et al. | |
| 2002/0000599 A1 | 1/2002 | Mizukoshi et al. | |
| 2003/0148570 A1 | 8/2003 | Rhodes | |
| 2005/0164479 A1 * | 7/2005 | Perng et al. | 438/591 |

* cited by examiner

*Primary Examiner*—Michael Lebentritt
*Assistant Examiner*—Elias Ullah
(74) *Attorney, Agent, or Firm*—Todd M. C. Li; Hoffman, Warnick & D'Alessandro LLC

(57) ABSTRACT

Methods of etching silicon nitride material, and more particularly, etching nitride selective to silicon dioxide or silicide, are disclosed. The methods include exposing a substrate having silicon nitride thereon to a plasma including at least one fluorohydrocarbon and a non-carbon containing fluorine source such as sulfur hexafluoride ($SF_6$). The plasma may also include oxygen ($O_2$) and the fluorohydrocarbons may include at least one of: trifluoromethane ($CHF_3$), difluoromethane ($CH_2F_2$), and methyl fluoride ($CH_3F$). In an alternative embodiment, the plasma includes one of hydrogen ($H_2$) and nitrogen trifluoride ($NF_3$) and one of tetrafluoromethane ($CF_4$) and octafluorocyclobutane ($C_4F_8$). The methods are preferably carried out using a low bias voltage, e.g. <100 V.

18 Claims, 1 Drawing Sheet

$C_xH_yF_z$, $O_2$, non-carbon flourine source
or $H_2$ or $NF_3$ with $CF_4$ or $C_4F_8$ $C_xH_yF_z$, $O_2$, non-carbon flourine source
or $H_2$ or $NF_3$ with $CF_4$ or $C_4F_8$

SILICON NITRIDE ETCHING METHODS

BACKGROUND OF THE INVENTION

1. Technical Field

The present invention relates generally to methods of etching, and more particularly, to methods of etching silicon nitride material.

2. Related Art

Etching of silicon nitride material has increasingly posed challenges in the semiconductor fabrication industry. One challenge of etching silicon nitride is maintaining selectivity. For example, due to integration constraints (e.g., lithography overlay issues, etches of subsequent deposited layers), a silicon dioxide mask used to etch silicon nitride is typically relatively thin (e.g., 100-200 Å), which allows limited etching. In other cases, where silicon nitride overlays a silicon dioxide, e.g., as part of a stressed nitride liner, the silicon nitride layer thickness needs to be increased to provide the required stress level to meet the device design requirements. Both these situations require a silicon nitride etch that is highly selective to the silicon dioxide. Furthermore, where silicon nitride overlays a silicide, the etch also needs to be very selective to the silicide to prevent thinning of the silicide which results in undesirable higher sheet resistance, and deposition of etched products on chamber walls, which results in chamber reliability issues. (The silicide thinning issue is magnified in a nickel silicide scheme since the silicide is typically thinner than in other schemes).

Another challenge is maintaining an isotropic etch, i.e., one in which the etch rate is the same in any direction. In particular, silicon nitride materials deposited on a substrate are not necessarily planar, which mandates an isotropic etch. Applying bias to the substrate results in an anisotropic etch, often resulting in residual nitride that forms "mini-spacers." Thus, an isotropic process with no or minimal bias is needed to laterally etch silicon nitride.

One conventional approach for etching silicon nitride in the presence of silicon oxides uses a mixture of methyl fluoride ($CH_3F$), tetrafluoromethane ($CF_4$) and oxygen ($O_2$) or a mixture of difluoromethane ($CH_2F_2$), tetrafluoromethane ($CF_4$) and oxygen ($O_2$), and is disclosed in U.S. Pat. No. 5,786,276 to Brooks et al. A disadvantage of this approach is that the bias voltage cannot be adjusted because it is a chemical downstream etching process.

In view of the foregoing, there is a need in the art for a silicon nitride etching method that does not suffer from the problems of the related art.

SUMMARY OF THE INVENTION

The invention includes methods of etching silicon nitride material, and more particularly, etching nitride selective to silicon dioxide or silicide. The methods include exposing a substrate having silicon nitride thereon to a plasma including at least one fluorohydrocarbon and a non-carbon containing fluorine source such as sulfur hexafluoride ($SF_6$). The plasma may also include oxygen ($O_2$) and the fluorohydrocarbons may include at least one of: trifluoromethane ($CHF_3$), difluoromethane ($CH_2F_2$), and methyl fluoride ($CH_3F$). In an alternative embodiment, the plasma includes one of hydrogen ($H_2$) and nitrogen trifluoride ($NF_3$) and one of tetrafluoromethane ($CF_4$) and octafluorocyclobutane ($C_4F_8$). The methods are preferably carried out using a low bias voltage, e.g. <100 V.

A first aspect of the invention is directed to a method of etching a substrate having a silicon nitride material thereon, the method comprising the steps of: providing a plasma including at least one fluorohydrocarbon and a non-carbon containing fluorine source; and exposing the substrate to the plasma to etch the silicon nitride material.

A second aspect of the invention includes a method of etching a substrate having a silicon nitride material thereon, the method comprising the steps of: providing a plasma including one of hydrogen ($H_2$) and nitrogen trifluoride ($NF_3$) and one of tetrafluoromethane ($CF_4$) and octafluorocyclobutane ($C_4F_8$); and exposing the substrate to the plasma to etch the silicon nitride material.

A third aspect of the invention related to a method of etching a substrate having a silicon nitride material thereon, the method comprising the steps of: providing a plasma including oxygen ($O_2$), a non-carbon containing fluorine source and at least one fluorohydrocarbon selected from the group consisting of: trifluoromethane ($CHF_3$), difluoromethane ($CH_2F_2$), and methyl fluoride ($CH_3F$); and exposing the substrate to the plasma to etch the silicon nitride material selective to at least one of a silicon dioxide or a silicide.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
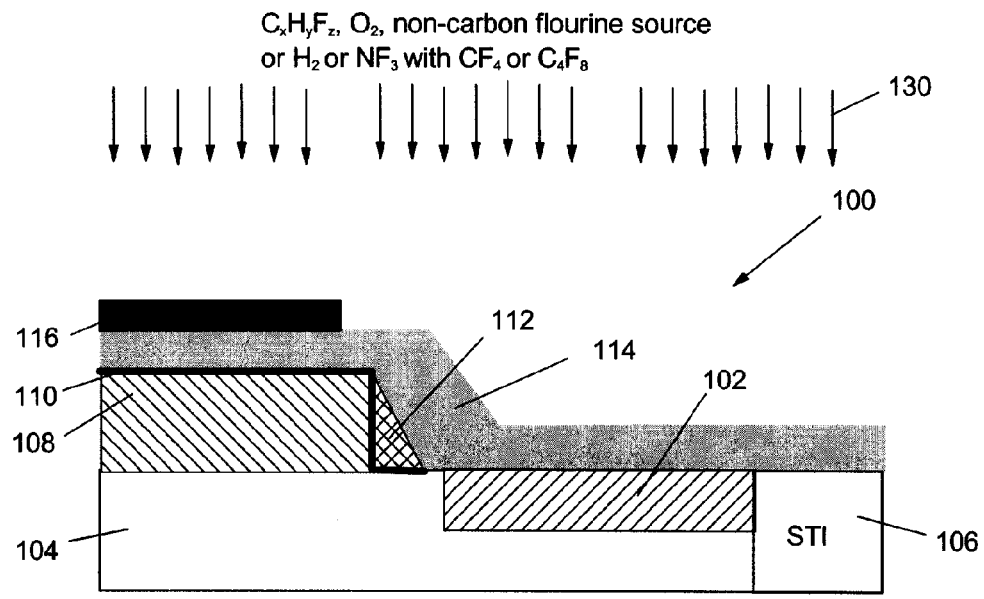
FIG. 1 shows an illustrative structure including a silicon nitride liner for which the methods of the invention are applicable.
Figure 2:
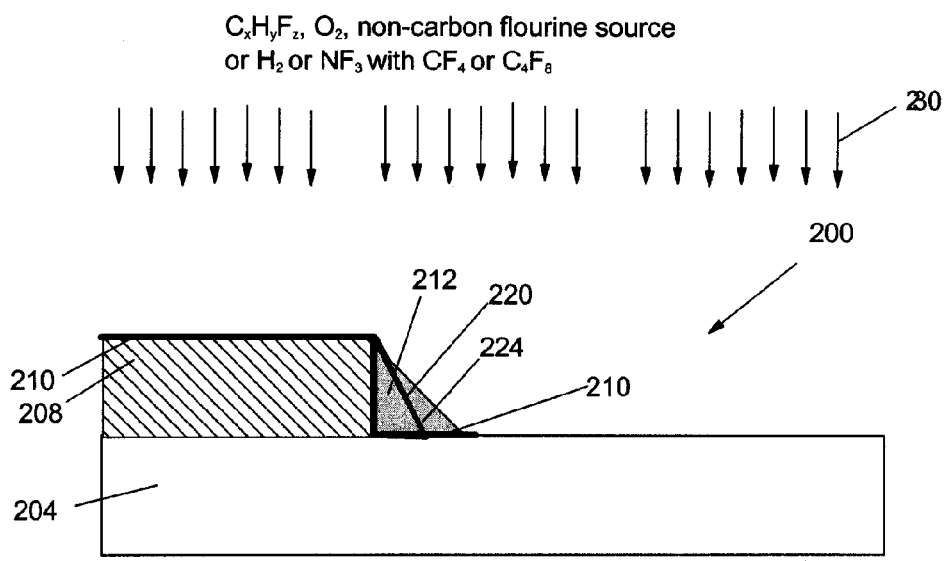
FIG. 2 shows another illustrative structure including a triple spacer scheme for which the methods of the invention are applicable.

With reference to the accompanying drawings, FIGS. 1-2 show two illustrative structures for describing the methods of etching a substrate having a silicon nitride material according to the invention. It should be recognized that application of the invention is not limited to these particular structures.

FIG. 1 shows a structure 100 in the form of a silicon nitride liner scheme in which a silicide portion 102, e.g., cobalt silicide, tungsten silicide, nickel silicide, etc., is provided in a substrate 104 adjacent a shallow trench isolation (STI) 106. A gate 108 is provided on substrate 104 and includes a silicon dioxide (SiO2) protective layer 110 and a spacer 112. A liner 114 including silicon nitride material is laid over gate 108. A silicon dioxide mask 116 overlays portions of structure 100 for etching of silicon nitride liner 114. In FIG. 1, silicon nitride liner 114 is to be stripped, where exposed by mask 116. FIG. 2 shows a structure 200 in the form of a triple spacer scheme in which a gate 208 is formed on a substrate 204. A protective silicon dioxide layer 210, a first silicon nitride spacer 212 covered by a silicon dioxide cover layer 220 and a second silicon nitride spacer 224 are also provided. In FIG. 2, silicon nitride spacer 224 is to be stripped.

With reference to both FIGS. 1 and 2, a method of etching substrate 104, 204 having a silicon nitride material thereon will now be described. In a first step, a plasma 130, 230 including at least one fluorohydrocarbon ($C_xH_yF_z$) and a non-carbon containing fluorine source are provided in any now known or later developed fashion. Plasma 130, 230 may further include oxygen ($O_2$). Next, substrate 104, 204 is exposed to plasma 130, 230 to etch the silicon nitride material. In one embodiment, the non-carbon containing fluorine source includes sulfur hexafluoride ($SF_6$), however, other sources may be used such as nitrogen trifluoride ($NF_3$). The fluorohydrocarbon(s) is preferably chosen from trifluoromethane ($CHF_3$), difluoromethane ($CH_2F_2$), and methyl fluoride ($CH_3F$). In one embodiment, all three listed fluorohydrocarbons are used. In this case, plasma 130, 230 preferably includes the following percentage ranges of trifluoromethane ($CHF_3$), methyl fluoride ($CH_3F$), oxygen ($O_2$) and sulfur hexafluoride ($SF_6$): $10\% \leq CHF_3 \leq 35\%$, $10\% \leq CH_3F \leq 35\%$, $10\% \leq O_2 \leq 50\%$, and $2\% \leq SF_6 \leq 10\%$. In one embodiment, plasma 130, 230 is provided at a pressure of no less than 50 mT and no greater than 100 mT and a chamber power of no less than 0.05 W/cc and no greater than 0.25 W/cc.

The invention also includes using no or low bias voltage for the process. For example, in one preferred embodiment, plasma 130, 230 is a transformer coupled plasma (TCP) having a bias voltage of no greater than 100 V, and more preferably of no greater than 50 V. The TCP scheme has also been found advantageous for a number of reasons. First, it allows for adjustment of the bias voltage for fine tuned selectivity and an isotropic etch, which is not available in other schemes such as a chemical downstream etch (CDE). Second, it can provide a low voltage which also allows for fine tuned selectivity and an isotropic etch, and is not available in other schemes such as a reactive ion etch (RIE) tools using capacitively coupled plasma (CCP). RIE CCP tools have an inherently high bias on account of the fundamental tool configuration. Third, a TCP scheme has the advantage of high plasma densities that result in very low Vdc, thus allowing for both a soft (or highly selective) etch and providing an isotropic etch. By employing a minimal bias on the wafer, the polymer may be selectively sputtered off of the silicon nitride (allowing free F to etch the nitride) without removing the entire thickness of polymer from silicon dioxide. Excessive bias will lead to a loss of selectivity to silicon dioxide, as the polymer yield increases beyond that required to remove the entire thickness of polymer from the oxide, and allow F to attack the oxide.

The above-described method etches the silicon nitride material selective to an underlying silicon dioxide, e.g., layer 210 in FIG. 2, and/or an underlying silicide, e.g., silicide 102 in FIG. 1. With regard to selectivity to silicide, the above-described method is selective to cobalt silicide and nickel silicide.

The addition of a non-carbon fluorine source, and in particular, sulfur hexafluoride ($SF_6$) decreases a silicon dioxide etch rate beyond a value of sulfur hexafluoride ($SF_6$) flow. In particular, sulfur hexafluoride ($SF_6$) flow rate is increased, at and beyond a particular flow rate, the etch rate of silicon dioxide drastically drops. The drop in silicon dioxide etch rate results in a very high silicon nitride etch selectivity. In addition, it forms a deposition on silicon dioxide (not shown) while maintaining the silicon nitride etch, resulting in extremely high selectivity. This result is counterintuitive to the expected outcome, which would be that the increase in fluorine (F) in the surface deposit would lower selectivity because of the fluorine-to-carbon ratio increase. Unexpectedly, however, the selectivity is improved. While the exact reasoning for this observation has not been investigated, it is surmised that the sulphur (S) may modify the sticking coefficient of the deposit on the silicon dioxide, but not on the silicon nitride. As a result, the silicon nitride material is etched quicker.

In an alternative embodiment, plasma 130, 230 includes hydrogen ($H_2$) or nitrogen trifluoride ($NF_3$) and tetrafluoromethane ($CF_4$) or octafluorocyclobutane ($C_4F_8$).

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of etching a substrate having a silicon nitride material thereon, the method comprising:
    providing a plasma including methyl fluoride ($CH_3F$) and a non-carbon containing fluorine source including sulfur hexafluoride ($SF_6$); and
    exposing the substrate to the plasma to etch the silicon nitride material selective to at least one of an underlying silicon dioxide and an underlying silicide.

2. The method of claim 1, wherein the plasma further includes trifluoromethane ($CHF_3$) and oxygen ($O_2$).

3. The method of claim 2, wherein the plasma includes the following percentage ranges of trifluoromethane ($CHF_3$), methyl fluoride ($CH_3F$), oxygen ($O_2$) and sulfur hexafluoride ($SF_6$): $10\% \leq CHF_3 \leq 35\%$, $10\% \leq CH_3F \leq 35\%$, $10\% \leq O_2 \leq 50\%$, and $2\% \leq SF_6 \leq 10\%$.

4. The method of claim 1, wherein the plasma providing step includes providing a pressure of no less than 50 mT and no greater than 100 mT and a chamber power of no less than 0.05 W/cc and no greater than 0.25 W/cc.

5. The method of claim 1 wherein the underlying silicide is chosen from the group consisting of: cobalt silicide and nickel silicide.

6. The method of claim 1, wherein the plasma is a transformer coupled plasma having a bias voltage of no greater than 100 V.

7. The method of claim 6, wherein the bias voltage is no greater than 50 V.

8. A method of etching a substrate having a silicon nitride material thereon, the method comprising:
    providing a plasma including hydrogen ($H_2$) and octafluorocyclobutane ($C_4F_8$); and
    exposing the substrate to the plasma to etch the silicon nitride material selective to at least one of an underlying silicon dioxide and an underlying silicide.

9. The method of claim 8, wherein the plasma providing step includes providing a pressure of no less than 50 mT and no greater than 100 mT and a chamber power of no less than 0.05 W/cc and no greater than 0.25 W/cc.

10. The method of claim 8, wherein the underlying silicide is chosen from the group consisting of: cobalt silicide and nickel silicide.

11. The method of claim 8, wherein the plasma is a transformer coupled plasma having a bias voltage of no greater than 100 V.

12. The method of claim 11, wherein the bias voltage is no greater than 50 V.

13. A method of etching a substrate having a silicon nitride material thereon, the method comprising:
    providing a plasma including oxygen ($O_2$), a non-carbon containing fluorine source including sulfur-hexafluorine ($SF_6$) and methyl fluoride ($CH_3F$); and exposing the substrate to the plasma to etch the silicon nitride material selective to at least one of an underlying silicon dioxide and an underlying silicide.

14. The method of claim 13, wherein the plasma includes the following percentage ranges of trifluoromethane ($CHF_3$), methyl fluoride ($CH_3F$), oxygen ($O_2$) and sulfur hexafluoride ($SF_6$): $10\% \leq CHF_3 \leq 35\%$, $10\% \leq CH_3F \leq 35\%$, $10\% \leq O_2 \leq 50\%$, and $2\% \leq SF_6 \leq 10\%$.

15. The method of claim 13, wherein the plasma providing step includes providing a pressure of no less than 50 mT and no greater than 100 mT and a chamber power of no less than 0.05 W/cc and no greater than 0.25 W/cc.

16. The method of claim 13, wherein the underlying silicide is chosen from the group consisting of: cobalt silicide and nickel silicide.

17. The method of claim 13, wherein the plasma is a transformer coupled plasma having a bias voltage of no greater than 100 V.

18. The method of claim 17, wherein the bias voltage is no greater than 50 V.

* * * * *

UNITED STATES PATENT AND TRADEMARK OFFICE
CERTIFICATE OF CORRECTION

PATENT NO. : 7,288,482 B2  
APPLICATION NO. : 10/908252  
DATED : October 30, 2007  
INVENTOR(S) : Siddhartha Panda et al.

Page 1 of 1

It is certified that error appears in the above-identified patent and that said Letters Patent is hereby corrected as shown below:

On the Title Page, (73) should read as follows:

--Assignee: "International Business Machines Corporation, Armonk, NY (US) and Advanced Micro Devices, Inc., Sunnyvale, CA (US)"--

Signed and Sealed this

First Day of July, 2008

JON W. DUDAS  
*Director of the United States Patent and Trademark Office*